(12) United States Patent
Wasinger et al.

(10) Patent No.: US 7,993,485 B2
(45) Date of Patent: Aug. 9, 2011

(54) METHODS AND APPARATUS FOR PROCESSING A SUBSTRATE

(75) Inventors: Erik C. Wasinger, Naperville, IL (US); Gary C. Ettinger, Cupertino, CA (US); Sen-Hou Ko, Sunnyvale, CA (US); Wei-Yung Hsu, Santa Clara, CA (US); Liang-Yuh Chen, Foster City, CA (US); Ho Seon Shin, Cupertino, CA (US); Donald Olgado, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 940 days.

(21) Appl. No.: 11/299,295

(22) Filed: Dec. 9, 2005

(65) Prior Publication Data

US 2007/0131654 A1   Jun. 14, 2007

(51) Int. Cl.
*C03C 15/00* (2006.01)
*H01I 21/306* (2006.01)

(52) U.S. Cl. .................. 156/345.12; 156/345.2; 451/81

(58) Field of Classification Search ............. 156/345.12, 156/345, 345.2; 451/81
See application file for complete search history.

(56) References Cited

U.S. PATENT DOCUMENTS

| | | | |
|---|---|---|---|
| 4,533,399 A | 8/1985 | Mencke | |
| 6,257,953 B1 | 7/2001 | Gitis et al. | |
| 6,334,229 B1 | 1/2002 | Moinpour et al. | |
| 6,402,596 B1 | 6/2002 | Hakomori et al. | |
| 6,494,985 B1 * | 12/2002 | Sotozaki et al. | 156/345.12 |
| 6,622,334 B1 | 9/2003 | Ziemins et al. | |
| 6,629,875 B2 | 10/2003 | Steere, III | |
| 6,641,464 B1 * | 11/2003 | Steere, III | 451/41 |
| 6,739,947 B1 | 5/2004 | Molnar | |
| 6,773,335 B2 | 8/2004 | Hakomori | |
| 6,837,777 B2 | 1/2005 | Ziemins et al. | |
| 6,933,234 B2 | 8/2005 | Nakamura et al. | |
| 7,066,787 B2 | 6/2006 | Nakanishi et al. | |
| 7,115,023 B1 | 10/2006 | Owczarz | |
| 7,179,154 B1 | 2/2007 | Boyd et al. | |
| 7,217,662 B2 | 5/2007 | Toyota et al. | |
| 7,367,873 B2 | 5/2008 | Ishii et al. | |
| 7,559,989 B1 * | 7/2009 | Conley | 118/211 |

(Continued)

FOREIGN PATENT DOCUMENTS

JP     60242954 A  * 12/1985

(Continued)

OTHER PUBLICATIONS

"Nihon Micron Coating Co., Ltd—Silicon Wafer Edge Polisher", Jul. 2000, printed Sep. 24, 2009, available at http://www.mipox.co.jp/en/products/2a_machinepoli.html.*

(Continued)

*Primary Examiner* — Sylvia R. MacArthur
(74) *Attorney, Agent, or Firm* — Dugan & Dugan, PC

(57) ABSTRACT

Apparatus and methods adapted to polish an edge of a substrate include a polishing film, a frame adapted to tension and load the polishing film so that at least a portion of the film is supported in a plane, and a substrate rotation driver adapted to rotate a substrate against the plane of the polishing film such that the polishing film is adapted to apply force to the substrate, contour to an edge of the substrate, the edge including at least an outer edge and a first bevel, and polish the outer edge and the first bevel as the substrate is rotated. Numerous other aspects are provided.

23 Claims, 14 Drawing Sheets

U.S. PATENT DOCUMENTS

| | | | |
|---|---|---|---|
| 2002/0007840 A1 | 1/2002 | Atoh | |
| 2004/0000326 A1 | 1/2004 | Ziemins et al. | |
| 2004/0185751 A1 | 9/2004 | Nakanishi et al. | |
| 2006/0243304 A1 | 11/2006 | Hsu et al. | |
| 2006/0252355 A1 | 11/2006 | Kumasaka | |
| 2007/0131653 A1 | 6/2007 | Ettinger et al. | |
| 2007/0238393 A1 | 10/2007 | Shin et al. | |
| 2008/0216867 A1 | 9/2008 | Hsu et al. | |
| 2009/0017731 A1 | 1/2009 | Ettinger et al. | |
| 2009/0029629 A1 | 1/2009 | Shin et al. | |
| 2009/0036033 A1 | 2/2009 | Wasinger et al. | |
| 2009/0036039 A1 | 2/2009 | Shin et al. | |
| 2009/0036042 A1 | 2/2009 | Shin et al. | |
| 2009/0038642 A1 | 2/2009 | Hsu et al. | |

FOREIGN PATENT DOCUMENTS

| | | | |
|---|---|---|---|
| JP | 08001494 A | * | 1/1996 |
| JP | 11099458 A | * | 4/1999 |
| JP | 11099459 A | * | 4/1999 |
| WO | WO 2004025717 A1 | * | 3/2004 |
| WO | WO 2007-070353 A2 | | 6/2007 |

OTHER PUBLICATIONS

International Search Report and Written Opinion of International Application No. PCT/US07/07568 (10560/PCT) mailed on Jun. 24, 2008.

International Search Report and Written Opinion of International Application No. PCT/US06/46765 dated Oct. 2, 2007.

International Preliminary Report on Patentability of International Application No. PCT/US06/46765 dated Jun. 19, 2008.

"Silicon Wafer Edge Polishing Machine", Jul. 2000, MIPOX The Surface Technology Experts, [http://www.mipox.com/wafer_edg_polishing_machine.htm], printed on Jul. 20, 2005, pp. 1-2.

"Mipox—The Surface Technology Expert", Jul. 2000, MIPOX The Surface Technology Experts, [http://www.mipox.com/aboutus.htm], printed on Jul. 20, 2005, pp. 1-2.

"ALTB 200VT Auto Tape Burnish Machine", Jul. 2000, MIPOX The Surface Technology Experts, [http://www.mipox.com/tape_burnish_machine.htm], printed on Jul. 20, 2005, pp. 1-2.

"The Mipox Silicon Wafer Edge Polishing Machine", MIPOX Products Catalogue [http://www.mipox.com.my/info-products5.htm], printed on Jul. 20, 2005, pp. 1-2.

"Silicon Wafer Edge Polisher", Nihon Micro Coating Co., Ltd. Nano-Surface Technology Solution, Products & Services [http://www.mipox.co.jp/en/products/2a_machine/poli.html], printed on Jul. 20, 2005, pp. 1-2.

Final Office Action of U.S. Appl. No. 12/245,765 Mailed Mar. 15, 2010.

Notice of Abandonment of U.S. Appl. No. 12/239,730 Mailed Dec. 14, 2009.

Nov. 6, 2009 Response to Office Action of U.S. Appl. No. 12/245,765 Mailed Aug. 6, 2009.

Office Action of U.S. Appl. No. 11/298,555 Mailed Jun. 13, 2007.

Sep. 13, 2007 Response to Office Action of U.S. Appl. No. 11/298,555 Mailed Jun. 13, 2007.

Final Office Action of U.S. Appl. No. 11/298,555 Mailed Nov. 28, 2007.

Pre-Brief Conference Request of U.S. Appl. No. 11/298,555, filed Mar. 28, 2008.

Pre-Brief Conference Decision of U.S. Appl. No. 11/298,555 Mailed May 13, 2008.

Appeal Brief of U.S. Appl. No. 11/298,555, filed Jul. 14, 2008.

Examiner's Answer to Appeal Brief of U.S. Appl. No. 11/298,555 Mailed Sep. 9, 2008.

Reply Brief of U.S. Appl. No. 11/298,555, filed Nov. 10, 2008.

Office Action of U.S. Appl. No. 12/239,730 Mailed May 22, 2009.

Office Action of U.S. Appl. No. 12/245,765 Mailed Aug. 6, 2009.

Restriction Requirement of U.S. Appl. No. 11/298,555 mailed Apr. 12, 2007.

May 14, 2007 Response to Restriction Requirement of U.S. Appl. No. 11/298,555 mailed Apr. 12, 2007.

Notice of Abandonment of U.S. Appl. No. 12/245,765 Mailed Sep. 30, 2010.

Decision on Appeal of U.S. Appl. No. 11/298,555 mailed May 2, 2011.

* cited by examiner

METHODS AND APPARATUS FOR PROCESSING A SUBSTRATE

CROSS-REFERENCE TO RELATED APPLICATIONS

The present invention is related to U.S. patent application Ser. No. 11/298,555 filed on Dec. 9, 2005 and entitled "METHODS AND APPARATUS FOR PROCESSING A SUBSTRATE" which is hereby incorporated herein by reference for all purposes.

FIELD OF THE INVENTION

The present invention relates generally to substrate processing, and more particularly to methods and apparatus for cleaning an edge of a substrate.

BACKGROUND

Conventional systems, which contact a substrate edge with an abrasive film to clean the edge, may not thoroughly clean the edge. For example, the abrasive film may not sufficiently contact both bevels of the edge during cleaning. Additionally, the abrasive film may become worn from use, and therefore, lose its ability to sufficiently clean the substrate and require frequent replacement, which may affect semiconductor device manufacturing throughput. Accordingly improved methods and apparatus for cleaning an edge of a substrate are desired.

SUMMARY OF THE INVENTION

In a first aspect of the invention, an apparatus adapted to polish an edge of a substrate includes a polishing film, a frame adapted to tension the polishing film so that at least a portion of the film is supported in a plane, and a substrate rotation driver adapted to rotate a substrate against the plane of the polishing film such that the polishing film is adapted to apply tension to the substrate, contour to an edge of the substrate which includes at least an outer edge and a first bevel, and polish the outer edge and the first bevel as the substrate is rotated.

In a second aspect of the invention an apparatus adapted to polish an edge of a substrate includes a plurality of polishing films, a frame adapted to tension each of the polishing films so that at least a portion of each of the films are supported in a respective plane, and a substrate rotation driver adapted to rotate a substrate against at least one of the respective planes of the polishing films such that any polishing films contacting the substrate apply pressure to the substrate, contour to an edge of the substrate, and polish the edge as the substrate is rotated.

In a third aspect of the invention an apparatus adapted to polish an edge of a substrate includes a polishing film having a polishing side and a second side, an inflatable pad disposed adjacent the second side of the polishing film, a frame adapted to support the polishing film and the inflatable pad, and a substrate rotation driver adapted to rotate a substrate against the polishing side of the polishing film. The polishing film is disposed between an edge of the substrate and the inflatable pad so that the inflatable pad and polishing film contour to the edge of the substrate and the polishing film contacts the edge of the substrate.

In a fourth aspect of the invention a method of cleaning an edge of a substrate includes (a) supporting a polishing film, (b) conforming the polishing film to an edge of a substrate, the edge including an outer edge and at least one bevel, and (c) rotating the substrate.

Other features and aspects of the present invention will become more fully apparent from the following detailed description, the appended claims and the accompanying drawings.

DETAILED DESCRIPTION

Figure 1:
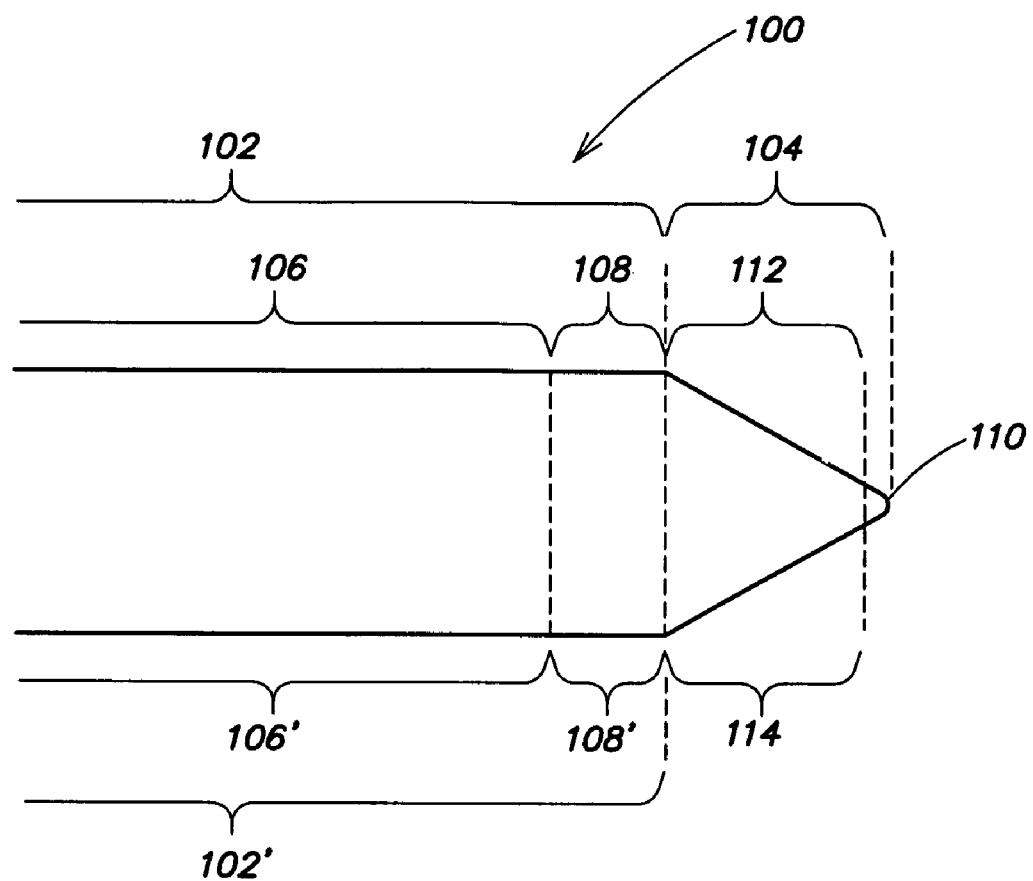
FIG. 1 is a schematic illustration of a cross-section of a portion of a substrate.

The present invention provides improved methods and apparatus for cleaning and/or polishing the edge of a substrate. With reference to FIG. 1, a substrate 100 may include two major surfaces 102, 102' and an edge 104. Each major surface 102, 102' of the substrate 100 may include a device region 106, 106' and an exclusion region 108, 108'. (Typically however, only one of the two major surfaces 102, 102' will include a device region and an exclusion region.) The exclusion regions 108, 108' may serve as buffers between the device regions 106, 106' and the edge 104. The edge 104 of a substrate 100 may include an outer edge 110 and bevels 112, 114. The bevels 112, 114 may be located between the outer edge 110 and the exclusion regions 108, 108' of the two major surfaces 102, 102'. The present invention is adapted to clean and/or polish the outer edge 110 and at least one bevel 112, 114 of a substrate 100 without affecting the device regions

106, 106'. In some embodiments, all or part of the exclusion regions 108, 108' may be cleaned or polished as well.

The present invention provides a frame for supporting a film (e.g., an abrasive polishing film) or abrasive buffer against the edge 104 of a substrate 100 as the substrate 100 is rotated (e.g., by a vacuum chuck, drive rollers, etc.). The film may be pressed against the rotating substrate edge 104 using a pad pushed by an actuator and/or an inflatable pad. In either case, the pad and/or inflatable pad may be soft and/or include or develop contours to conform with the shape of the substrate edge 104. Depending on the amount of force applied by the actuator, the resiliency of the pad selected, the amount of inflation of an inflatable pad, and/or the amount of tension on the film, a controlled amount of pressure may be applied to polish the edge 104. Alternatively or additionally, the film may be under tension within the frame such that the film itself is adapted to apply a variable amount of tension to the substrate edge 104 and to contour to both the outer edge 110 and at least one of the bevels 112, 114 (e.g., with or without additional support from a pad). Thus, the present invention provides precise control of an edge polish process which may be used to compensate for different edge geometries and changes in the substrate 100 as material is removed from the edge 104.

In some embodiments, the frame may support multiple heads, each head being adapted to support polishing film. The heads may support different types of films (e.g., films of different abrasive grits) which may be used concurrently, in a predefined sequence, or at different times. The heads may be disposed in different positions to allow the supported films to polish different portions of the edge 104 of the rotating substrate 100. The heads may be adapted to be moved (e.g., angularly translated about a tangential axis of the substrate 100 and/or circumferentially relative to the substrate 100) around the edge 104 by the frame so as to polish different portions of the edge 104. In some embodiments, the heads may continuously oscillate around the rotating edge 104 of the substrate 100. Each head may include an indexed spool of film and/or be contained in a replaceable cassette.

Additionally or alternatively, the present invention may include facilities to deliver fluids to the substrate edge 104 being polished. In some embodiments, one or more channels may be provided to direct chemicals or water to the substrate edge 104 to assist in the polishing and/or to wash away particles resulting from the polishing. The chemicals may be sprayed directly onto the substrate 100, at the substrate/polishing film interface, and/or may be applied to and/or through the film and/or pad. The fluids may be sprayed from either or both sides of the substrate 100 and the present invention may employ gravity or suction to cause the runoff not to contaminate or contact other parts of the substrate 100 or apparatus of the invention. Further, energy (e.g., megasonic energy) may be applied to the substrate edge 104 via fluid carrying such energy.

The substrate 100 may be rotated in a horizontal plane. In additional or alternative embodiments, the substrate 100 may be rotated in a vertical plane, other non-horizontal plane, and/or be moved between different planes of rotation.

Figure 2:
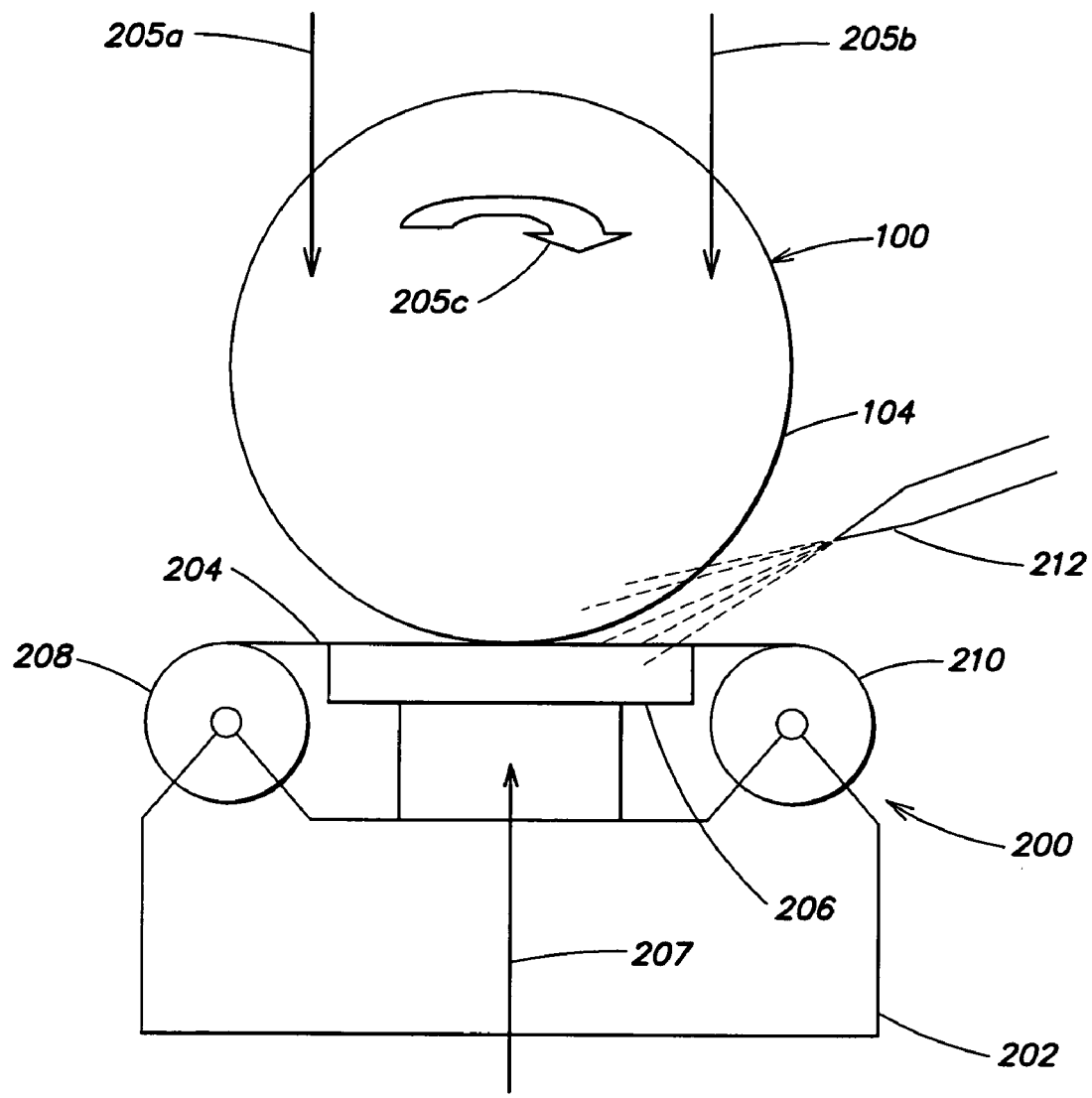
FIG. 2 is a schematic illustration depicting an example embodiment of an edge cleaning apparatus according to the present invention.

Turning to FIG. 2, a schematic view of an edge polishing apparatus 200 is depicted. A frame 202 supports and tensions a polishing film 204 in a plane perpendicular to the major surfaces 102, 102' of a substrate 100 such that the edge 104 of the substrate 100 may be pressed against (e.g., as indicated by the straight downward arrows 205a, 205b) the polishing film 204 and the polishing film 204 may contour to the substrate edge 104. As indicated by the curved arrow 205c, the substrate 100 may be rotated against the polishing film 204. The substrate 100 may be rotated at a rate ranging from about 50 to 300 RPM, for example, although other rates may be used. The substrate 100 may contact the polishing film 204 for about 15 to 150 seconds depending on the type of film used, the grit of the film, the rate of rotation, the amount of polishing required, etc. More or less time may be used. In some embodiments, the polishing film 204 may be supported by a pad 206 disposed adjacent a backside (e.g., a non-abrasive side) of the polishing film 204 and mounted on the frame 202. As indicated by the straight upward pointing arrow 207, the frame 202 including the tensioned polishing film 204 and/or the pad 206 may be pushed against the edge 104 of the substrate 100. In some embodiments, the substrate may be pushed against the polishing film with an amount of force ranging from about 0.5 lbs. to about 2.0 lbs. Other amounts of force may be used.

Additionally or alternatively, an additional length of the polishing film 204 may be supported and tensioned by spools 208, 210 mounted to the frame 202. A supply spool 208 may include unused polishing film 204 available to be unwound and pulled into position adjacent the substrate 100 while a take-up spool 210 may be adapted to receive used and/or worn polishing film 204. One or both of the spools 208, 210 may be indexed to precisely control the amount of polishing film 204 that is advanced. The polishing film 204 may be made from many different materials including aluminum oxide, silicon oxide, silicon carbide, etc. Other materials may also be used. In some embodiments, the abrasives used may range from about 0.5 microns up to about 3 microns in size although other sizes may be used. Different widths ranging from about 1 inch to about 1.5 inches may be used (although other widths may be used). In one or more embodiments, the polishing film may be about 0.002 to about 0.02 of an inch thick and be able to withstand about 1 to 5 lbs. of tension in embodiments that use a pad 206 and from about 3 to about 8 lbs. of tension in embodiments without a pad. Other films having different thicknesses and strengths may be used. The spools 208, 210 may be approximately 1 inch in diameter, hold about 500 inches of polishing film 204, and may be constructed from any practicable materials such as polyurethane, polyvinyl difloride (PVDF), etc. Other materials may be used. The frame 202 may be constructed from any practicable materials such as aluminum, stainless steel, etc.

In some embodiments, one or more fluid channels 212 (e.g., a spray nozzle or bar) may be provided to deliver chemicals and/or water to aid in the polishing/cleaning of the substrate edge 104, lubricate the substrate, and/or to wash away removed material. The fluid channel 212 may be adapted to deliver fluid to the substrate 100, to the polishing film 204, and/or to the pad 206. The fluids may include deionized water which may serve as a lubricant and to flush particles away. A surfactant and/or other known cleaning chemistries may also be included. In some embodiments, sonic (e.g., megasonic) nozzles may be used to deliver sonicated fluids to the substrate edge 104 to supplement the cleaning. Fluid also may be delivered through the polishing film 204 and/or pad 206 to the edge 104.

Figure 3A:
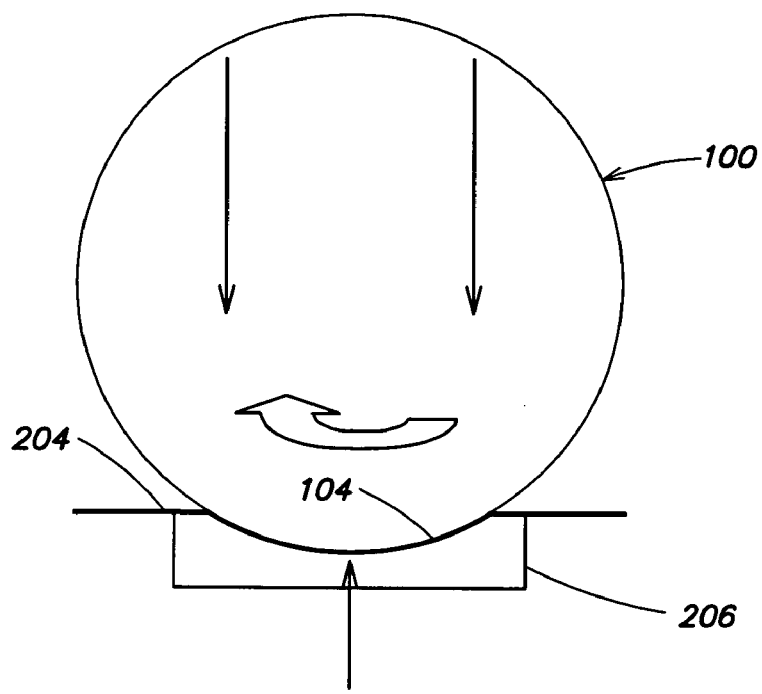
FIGS. 3A and 3B are close-up front and side cross-sectional schematic views, respectively, of a portion of the edge cleaning apparatus of FIG. 2.
Figure 3B:
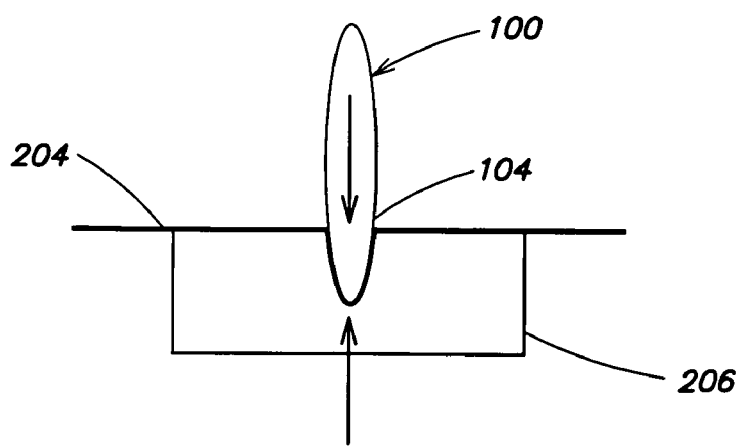

Turning to FIGS. 3A and 3B, close-up front and side cross-sectional schematic views, respectively, of the polishing film 204 and pad 206 of FIG. 2 are depicted. Note that the forces (indicated by the straight arrows) cause the polishing film 204 and the pad 206 to contour and conform to the edge 104 of the substrate 100. In some embodiments, if the substrate 100 was not present, the pad 206 would have a flat surface where the substrate 100 is shown compressing the pad 206. Likewise, if the substrate 100 was not present, the polishing film 204 would lie flat and be represented by a straight line in both views.

Figure 4:
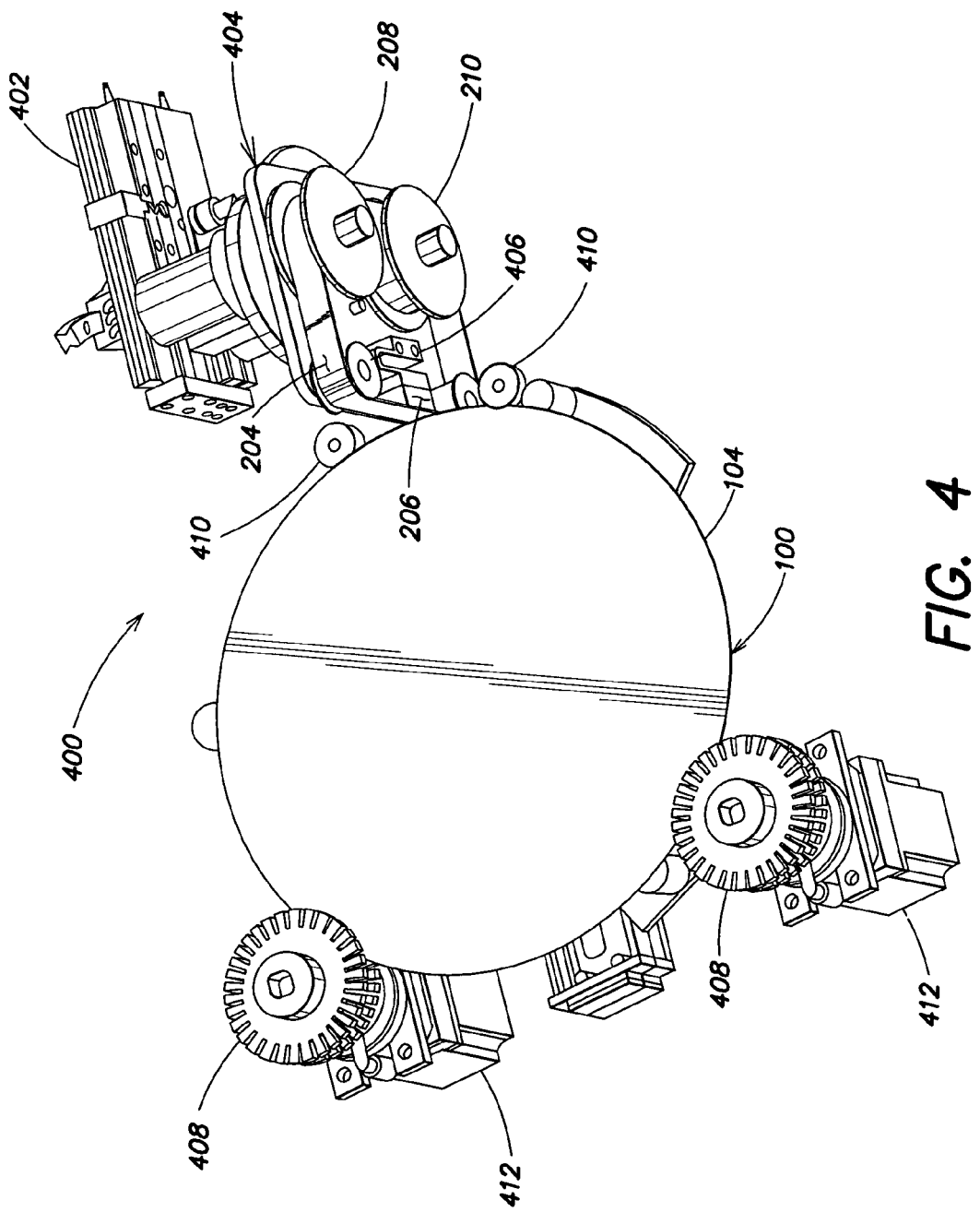
FIG. 4 is a perspective view depicting an example embodiment of an edge cleaning apparatus according to the present invention.
Figure 5:
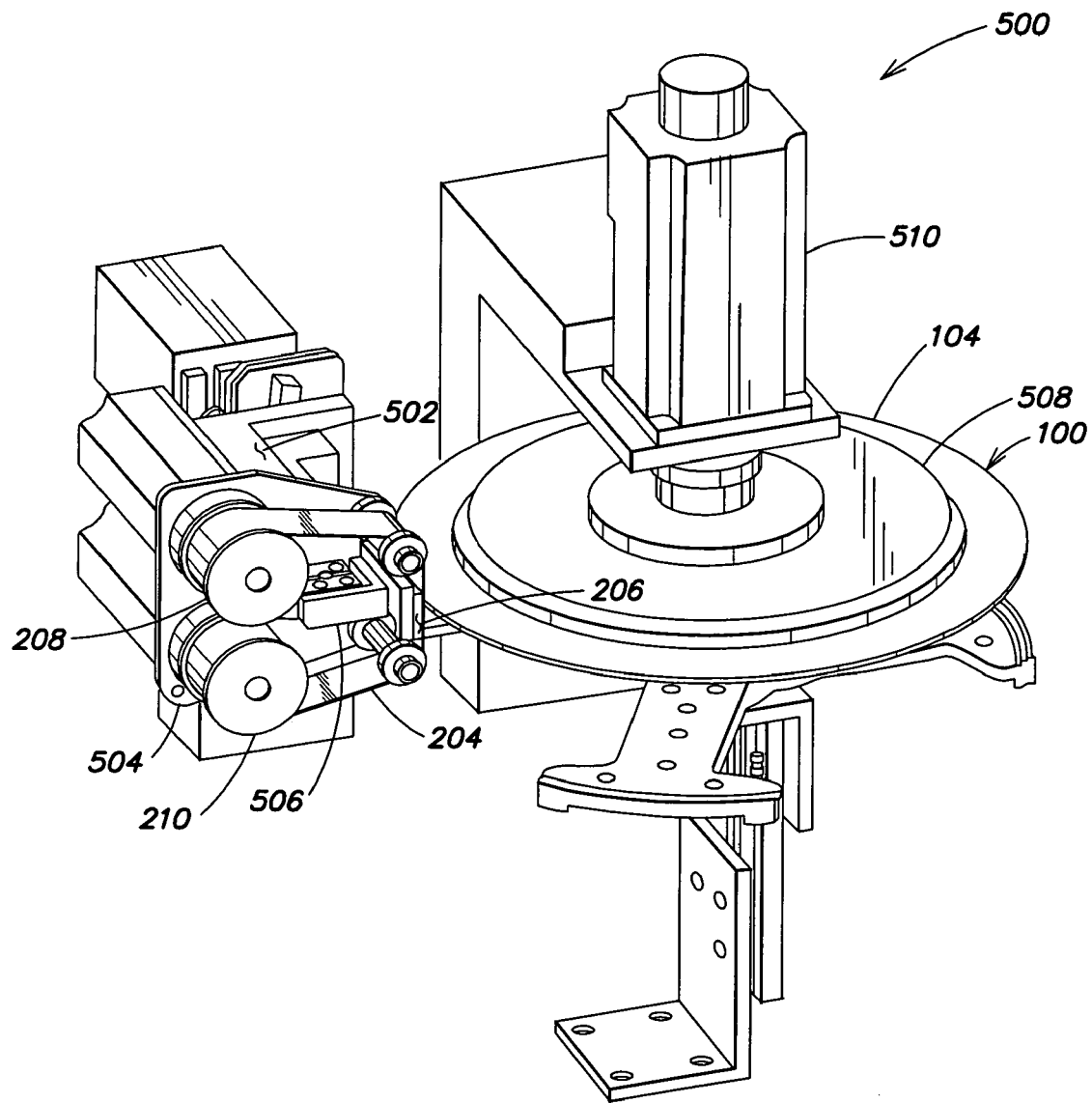
FIG. 5 is a perspective view depicting another example embodiment of an edge cleaning apparatus according to the present invention.

Turning now to FIGS. 4 and 5, two additional alternative embodiments of an edge polishing apparatus 400, 500 are depicted. As shown in FIG. 4, an example edge polishing apparatus 400 may include a base or frame 402 that includes a head 404 which supports polishing film 204 tensioned between spools 208, 210 and further supported by a pad 206. As shown, the pad 206 may by mounted to the head 404 via a biasing device 406 (e.g., a spring). The edge polishing apparatus 400 of FIG. 4 also may include one or more drive rollers 408 (two shown) and guide rollers 410 (two shown) that are adapted to rotate the edge 104 of the substrate 100 against the polishing film 204. The drive rollers 408 may themselves each be driven by drivers 412 (e.g., motors, gears, belts, chains, etc.).

The drive rollers 408 and guide rollers 410 may include a groove that allows the rollers 408, 410 alone to support the substrate 100. In some embodiments the groove within the drive rollers 408 may have a diameter of approximately 2.5 inches and the groove within the guide rollers 410 may have a diameter of approximately 1 inch. Other dimensions are possible. The area of the drive rollers 408 in contact with the substrate 100 may include texturing or cross-grooves to allow the drive rollers 408 to grip the substrate 100. The drive rollers 408 and guide rollers 410 may be constructed from materials such as polyurethane, polyvinyl difloride (PVDF), etc. Other materials may be used.

As shown in FIG. 5, another example edge polishing apparatus 500 may include a base or frame 502 that includes a head 504 which supports polishing film 204 tensioned between spools 208, 210 and further supported by a pad 206. As shown, the pad 206 may by mounted to the head 504 via an actuator 506 (e.g., a pneumatic slide, hydraulic ram, servo motor driven pusher, etc.). The edge polishing apparatus 500 of FIG. 5 also may include a vacuum chuck 508 coupled to a driver 510 (e.g., motor, gear, belt, chain, etc.). An advantage of the embodiment depicted in FIG. 5 is that the apparatus 500 does not need to contact the edge 104 being polished. Thus, the potential of particles accumulating on drive rollers and being re-deposited on the edge 104 is eliminated. The need to clean rollers also is eliminated. Further, the possibility of rollers damaging or scratching the edge is also eliminated. By holding the substrate in a vacuum chuck, high speed rotation without vibration may be achieved.

Turning now to FIGS. 6 through 8B, some details of features of the example embodiments of FIGS. 4 and 5 are described. Note that features from the different embodiments may be combined in many different practicable ways to serve different design principals or concerns.

Figure 6:
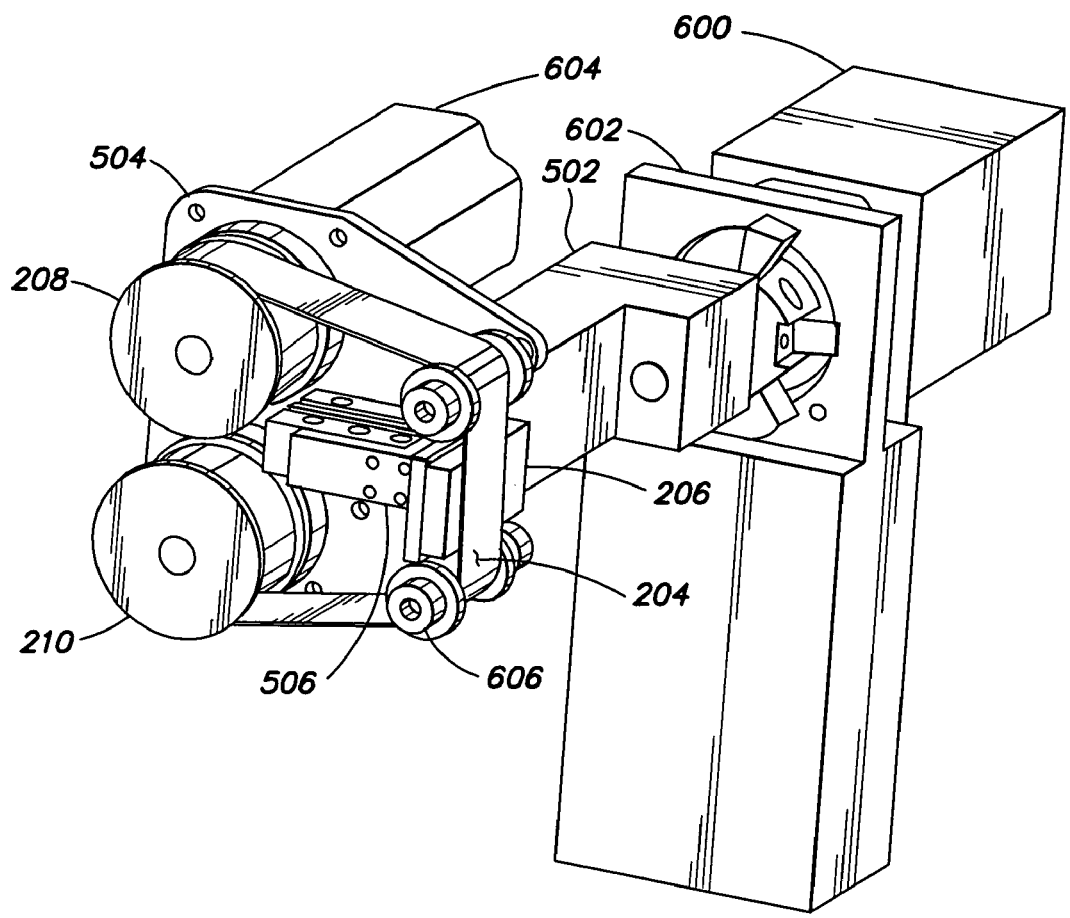
FIG. 6 is a perspective view of a portion of the example embodiment depicted in FIG. 5.

FIG. 6 depicts details of the frame 502 including the head 504 of FIG. 5. As described above, a head 504 supports polishing film 204 tensioned between spools 208, 210. The frame 502 (that includes head 504) may be adapted to be angularly translated (relative to an axis that is tangential to the edge 104 of a substrate 100 held in the edge polishing apparatus 500 (FIG. 5)) by a driver 600 (e.g., a servo motor) and pivot 602. The angular translation of the frame (and polishing film 204) is described in more detail below with respect to FIGS. 9A through 10C.

Additionally, the spools 208, 210 that are mounted to the head 504, may be driven by one or more drivers 604 (e.g., servo motors). The drivers 604 may provide both an indexing capability to allow a specific amount of unused polishing film 204 to be advanced or continuously fed to the substrate edge, and a tensioning capability to allow the polishing film to be stretched taught and to apply pressure to the substrate edge.

As can more clearly be seen in FIG. 6 (as compared to FIG. 5), the optional pad 206 may by mounted to the head 504 via an actuator 506 that is adapted to adjustably press and contour the polishing film 204 against a substrate edge 104 (FIG. 5). Further, one or more support rollers 606 may also be mounted to the head 504 to guide and align the polishing film 204 in a plane perpendicular to the major surface 102 (FIG. 1) of a substrate 100 held in the edge polishing apparatus 500 (FIG. 5).

Note that in the embodiment depicted in FIGS. 5 and 6, the length of the polishing film 204 is disposed orthogonal to the edge 104 of a substrate 100 being polished. This is in contrast to the embodiment depicted in FIG. 2, wherein the longitudinal direction of the polishing film 204 is aligned with the edge 104 of a substrate 100 being polished. Other polishing film orientations and configurations may be employed. For example, the polishing film 204 may be held diagonally relative to the major surface 102 of the substrate 100.

Figure 7A:
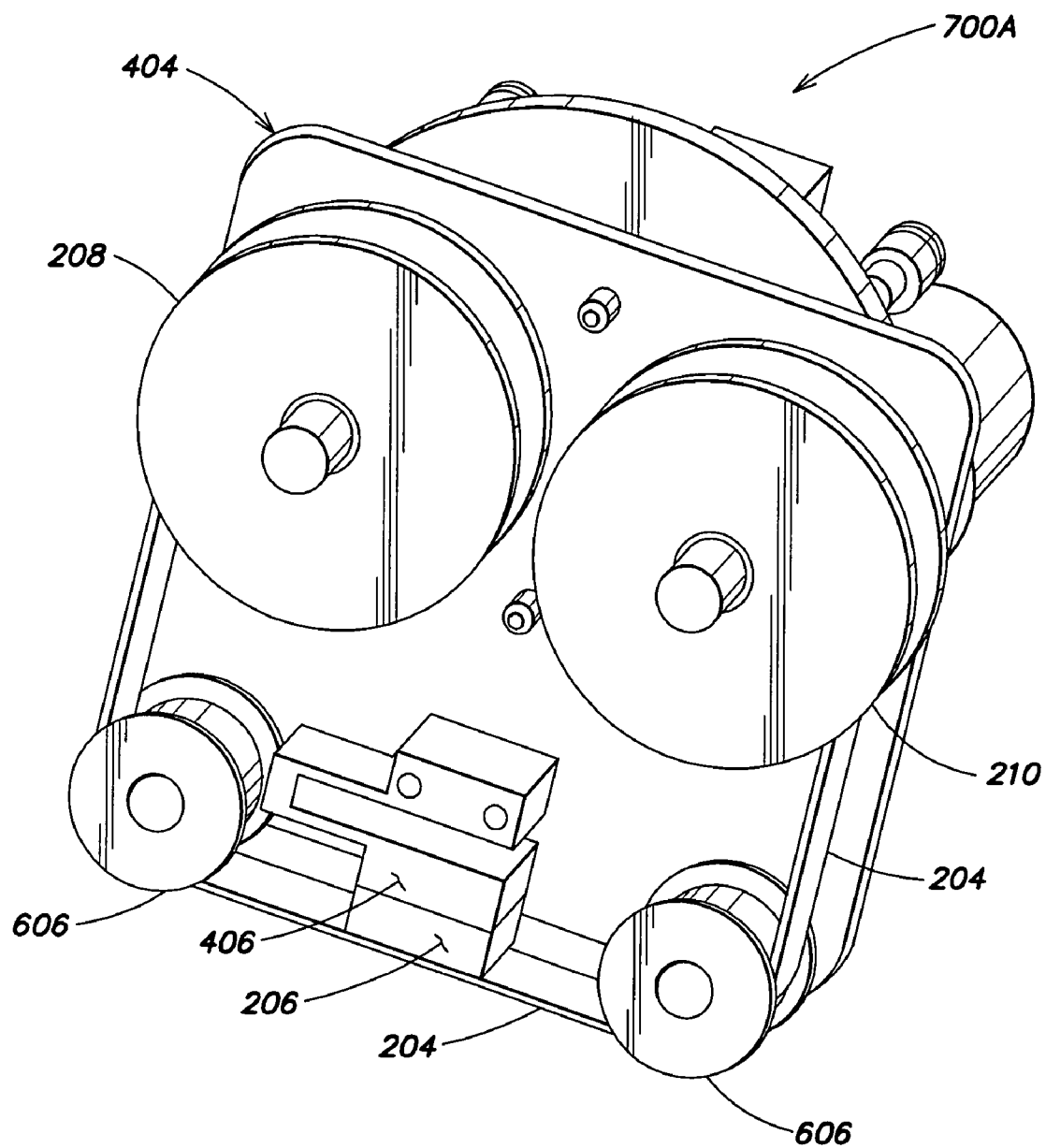
FIGS. 7A and 7B are close-up perspective views of different embodiments of replaceable cassettes for use with embodiments of the present invention.
Figure 7B:
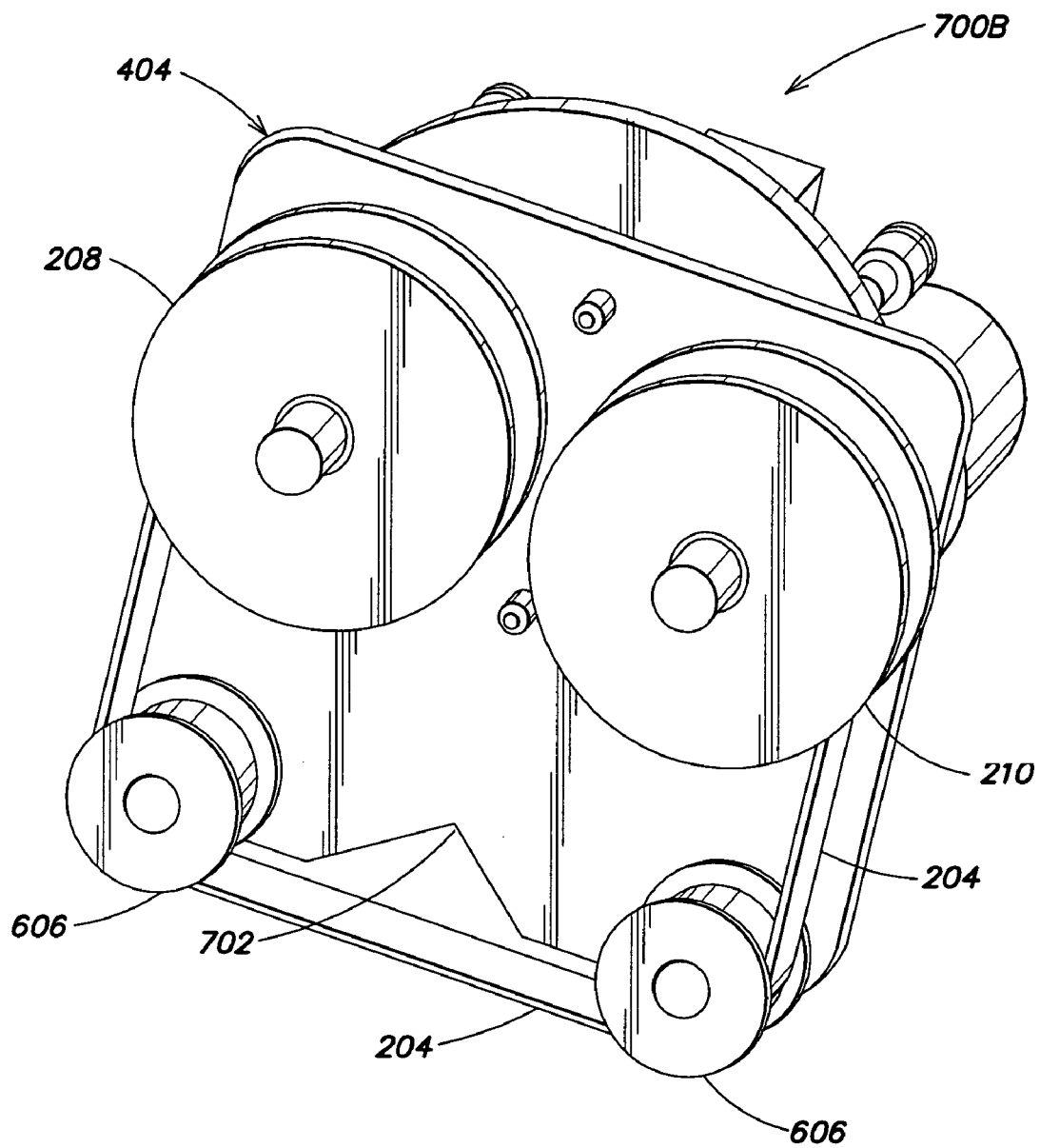

Turning to FIGS. 7A and 7B, close-up perspective views of two different embodiments of replaceable cassettes 700A, 700B are depicted. Cassettes 700A, 700B may be adapted to provide the features of the head 404 and polishing film 204 in a disposable, refillable, and/or replaceable package which may be quickly and easily mounted on and/or removed from the frames 402, 502 of different edge polishing apparatuses 400, 500.

As shown in FIG. 7A, the cassette 700A may include head 404 which supports polishing film 204 which spans from supply reel 208 to take-up reel 210. The polishing film 204 may be guided and aligned by support rollers 606 mounted to the head 404. A pad 206 may be provided to further support the polishing film 204 as described above. Also as described above, a biasing device 406 (e.g., a spring) may be employed to mount the pad 206 to the head 404 to provide flexible/dynamic counter-pressure to the pad 206. Alternatively or additionally, an adjustable actuator 506 (FIG. 6) may be used to push the pad 206 against the polishing film 204 or to push the entire head 404 toward the substrate 100.

In yet another alternative embodiment, as shown in FIG. 7B, instead of a pad 206, the head 404 may simply rely on the tension of the polishing film 204 to provide lateral pressure to the substrate edge 104 (FIG. 1). In some embodiments, the head 404 may include a notch 702 as shown in FIG. 7B to accommodate the substrate 100.

Figure 8A:
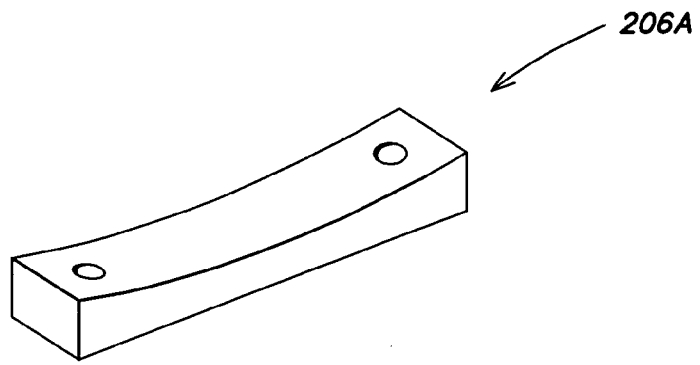
FIGS. 8A through 8C are close-up perspective views of different embodiments of pads for use with embodiments of the present invention.
Figure 8B:
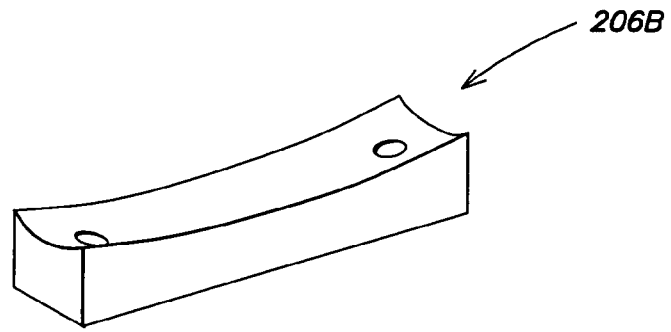

Turning to FIGS. 8A and 8B, two different alternative embodiments of pads 206A, 206B are depicted. In addition to a pad 206 (FIG. 6) that has a flat surface co-planar with the polishing film 204 when a substrate is not present, a pad 206A may include a concave surface that matches the contour of the edge 104 of a substrate 100. Alternatively, as shown in FIG. 8B, the pad 206B may include a double concave surface to better match the contour of the edge 104 of a substrate 100. In yet other alternative embodiments, a pad 206 may include a shaped groove that precisely matches the contour of the edge 104 of a substrate 100 including the bevels 112, 114 and outer edge 110 (FIG. 1).

The pads 206, 206A, 206B may be made of material such as, for example, an acetal resin (e.g., Delrin® manufactured by DuPont Corporation), PVDF, polyurethane closed cell foam, silicon rubber, etc. Other materials may be used. Such materials may have a resilience or an ability to conform that is a function of the thickness or density of the pad. The material may be selected based upon its resilience. The desired resilience may be selected based upon the type of polishing required.

Figure 8C:
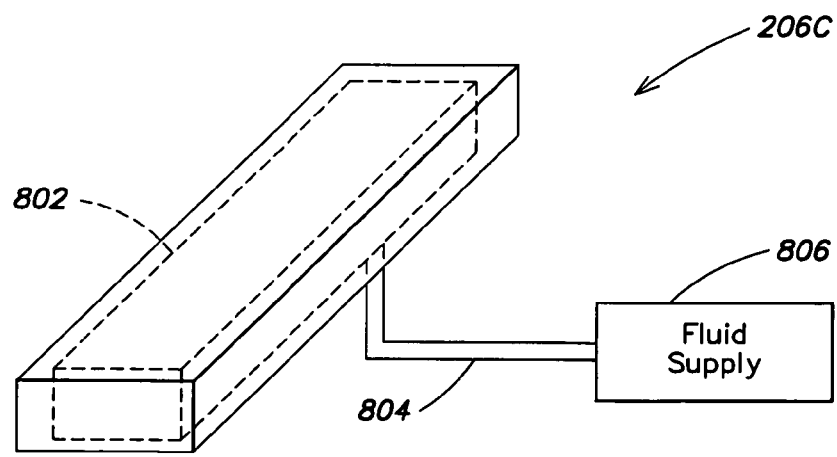
Figure 9A:
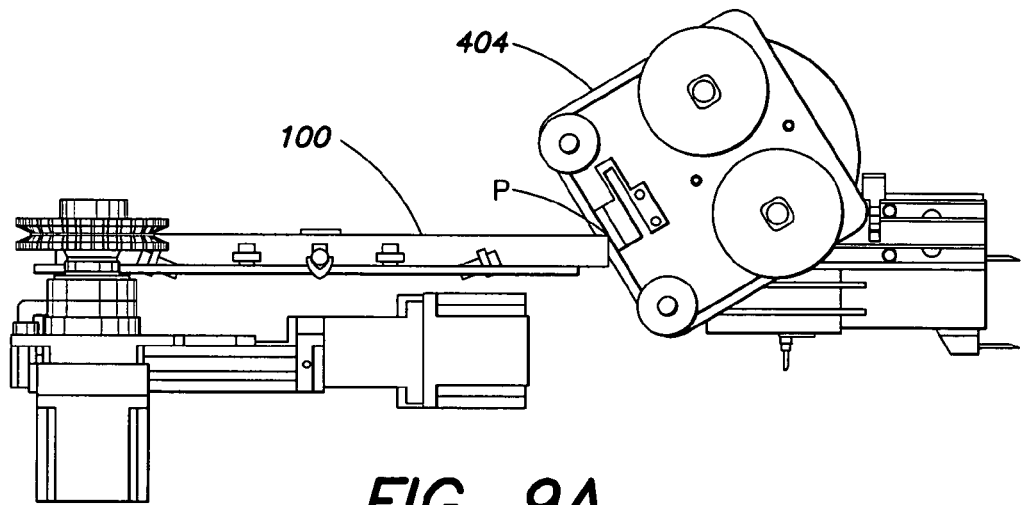
FIGS. 9A through 9C are plan views of examples of different possible head positions of the example edge polishing apparatus of FIG. 4.
Figure 9B:
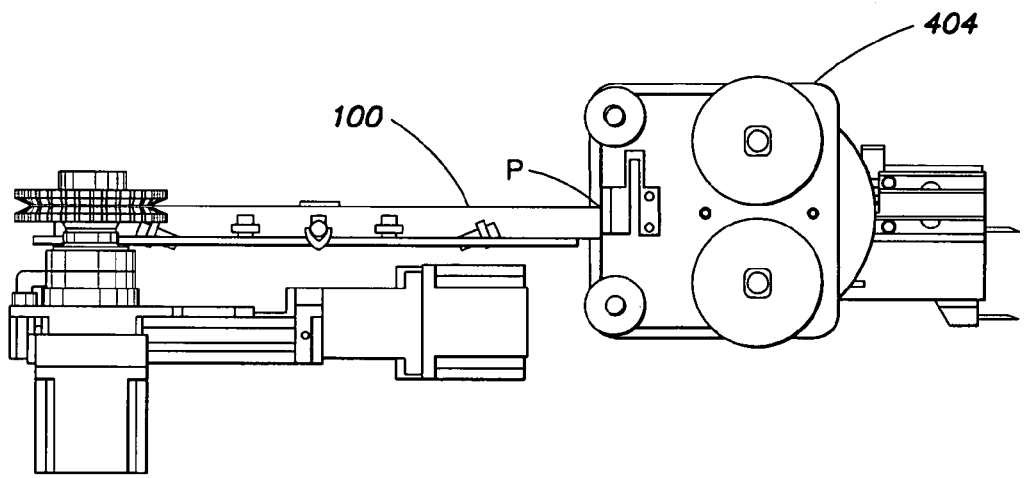
Figure 9C:
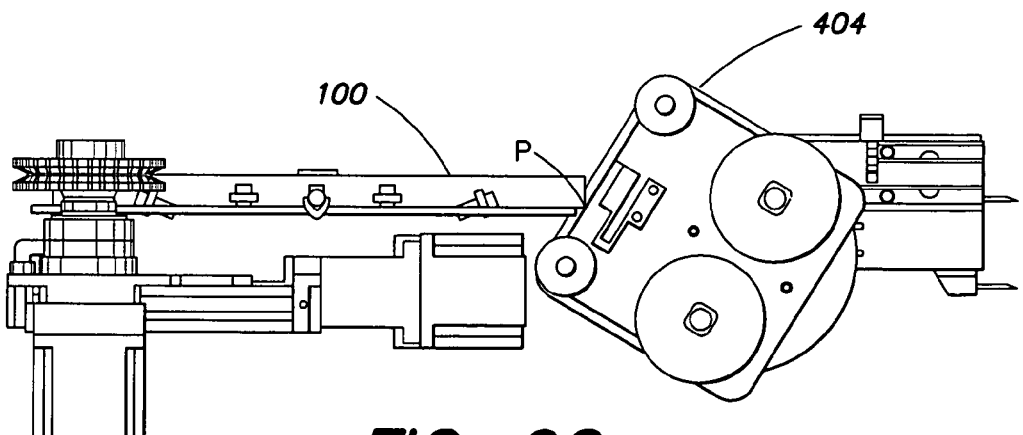
Figure 10C:
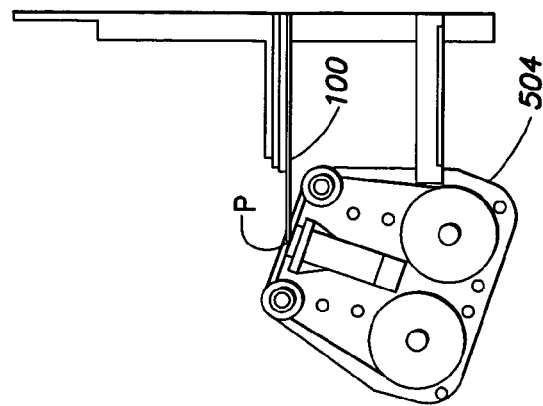
FIGS. 10A through 10C are plan views of examples of different possible head positions of the example edge polishing apparatus of FIG. 5.
Figure 10B:
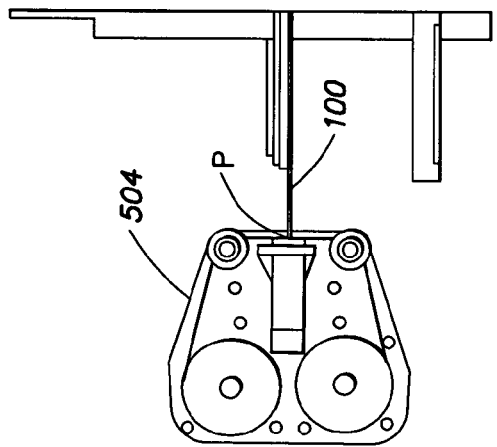
Figure 10A:
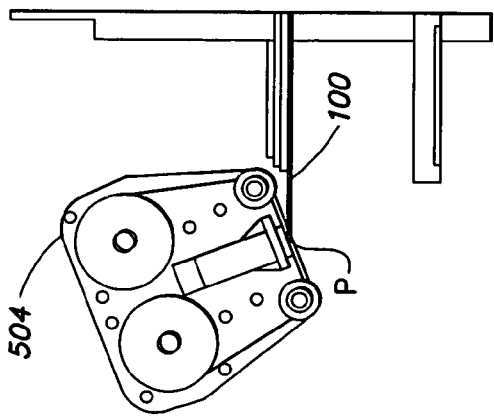

In some embodiments, the pad 206, 206A, 206B may have an adjustable amount of ability to conform to the substrate's edge. For example the pad 206, 206A, 206B may be or include an inflatable bladder such that by adding more air or liquid or other fluid, the pad becomes harder and by reducing the amount of air or liquid or other fluid in the bladder, the pad becomes more conforming. FIG. 8C depicts an embodiment of a pad 206C that includes an inflatable bladder 802 that may be filled (and/or emptied) via a fluid channel 804 with fluid from a fluid supply 806. In some embodiments, the fluid supply 806 may inflate/deflate the bladder 802 under the direction of an operator or a programmed and/or user operated controller. In such embodiments, an elastomeric material such as silicon rubber or the like, may be used for the bladder 802 to further enhance the pad's ability to stretch and conform to the substrate's edge 104. Such an embodiment would allow an operator/controller to precisely control how far beyond the bevels 112, 114 (if at all) and into the exclusion region 108 and/or 108' (FIG. 1) the polishing film 204 is made to contact the substrate 100 by, e.g., limiting the amount of fluid pumped into the bladder 802. For example, once a substrate outer edge 110 is placed against a pad 206C with a deflated bladder 802, the bladder 802 may be inflated so that the pad 206C is forced to wrap around and conform to the outer edge 110 and bevel (s) 112, 114 of the substrate 100 without wrapping around to the device region 106, 106' of the substrate 100. Note that in some embodiments, multiple bladders may be used in a pad and that differently shaped inflatable bladders may be used within differently shaped pads 206, 206A, 206B.

In some embodiments, fluids used to aid in the polishing may be delivered to the substrate edge via the pads 206, 206A, 206B. A fluid channel may be provided to drip or spray the fluid on or into the pads. Alternatively, an inflatable pad may include a bladder with a semi-permeable membrane that allows fluid to be slowly released and transmitted to the polishing film 204 (e.g., through the pad). In such embodiments, the pads 206, 206A, 206B may be covered by, made of, and/or include material that absorbs and/or retains the fluids used (e.g., polyvinyl alcohol (PVA), etc.).

FIGS. 9A through 9C and FIGS. 10A through 10C depict examples of different possible head positions of the alternative edge polishing apparatuses 400, 500 respectively, described above. The present invention is adapted to bring polishing film 204 in contact with the bevels 112, 114, and outer edge 110 of a substrate 100 without contacting the device region 106 of the substrate 100. In operation, this is achieved by angularly translating a head 404, 504 (and consequently, a portion of polishing film in contact with and contoured to the edge 104 of a substrate 100) around an axis that is tangential to the outer edge 110 of the substrate 100 as it is rotated. Referring to FIGS. 9A through 9C and FIGS. 10A through 10C, this axis of angular translation may be represented by a line extending perpendicular out of the paper upon which the FIGs. are drawn at the point labeled "P." The heads 404, 504 may be held in various positions to clean desired portions of the substrate edge 104 as the substrate 100 is rotated. In some embodiments, the heads 404, 504 may be adapted to continuously or intermittently oscillate between the various positions depicted and/or other positions. The heads 404, 504 may be moved on the frame 502 by drivers 600 (FIG. 6) under the direction of a programmed or user operated controller. Alternatively, the heads 404, 504 may be fixed and/or only adjusted while the substrate is not being rotated. In yet other embodiments, the substrate may be held fixed while the heads are oscillated (as described above) as well as rotated circumferentially around the substrate 100. Further, the polishing film 204 may be mounted on the heads 404, 504 in a continuous loop and/or the polishing film 204 may be continuously (or intermittently) advanced to polish the substrate edge 104. For example, the advancement of the film may be used to create or enhance the polishing motion. Any combination of the above described polishing motions and/or methods that are practicable may be employed.

Figure 11:
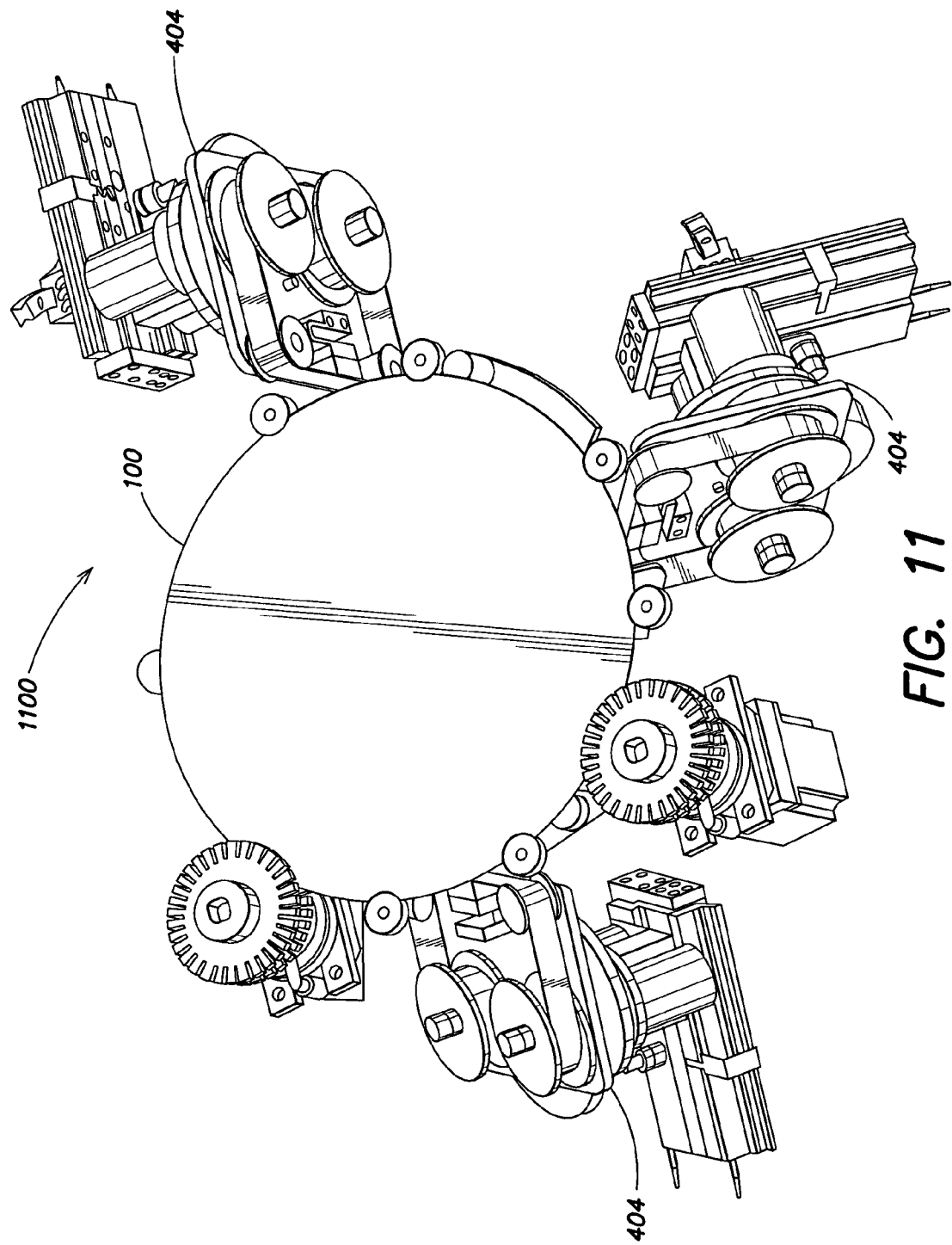
FIG. 11 is a perspective view of an embodiment of a multiple head edge polishing apparatus according to the present invention.
Figure 12:
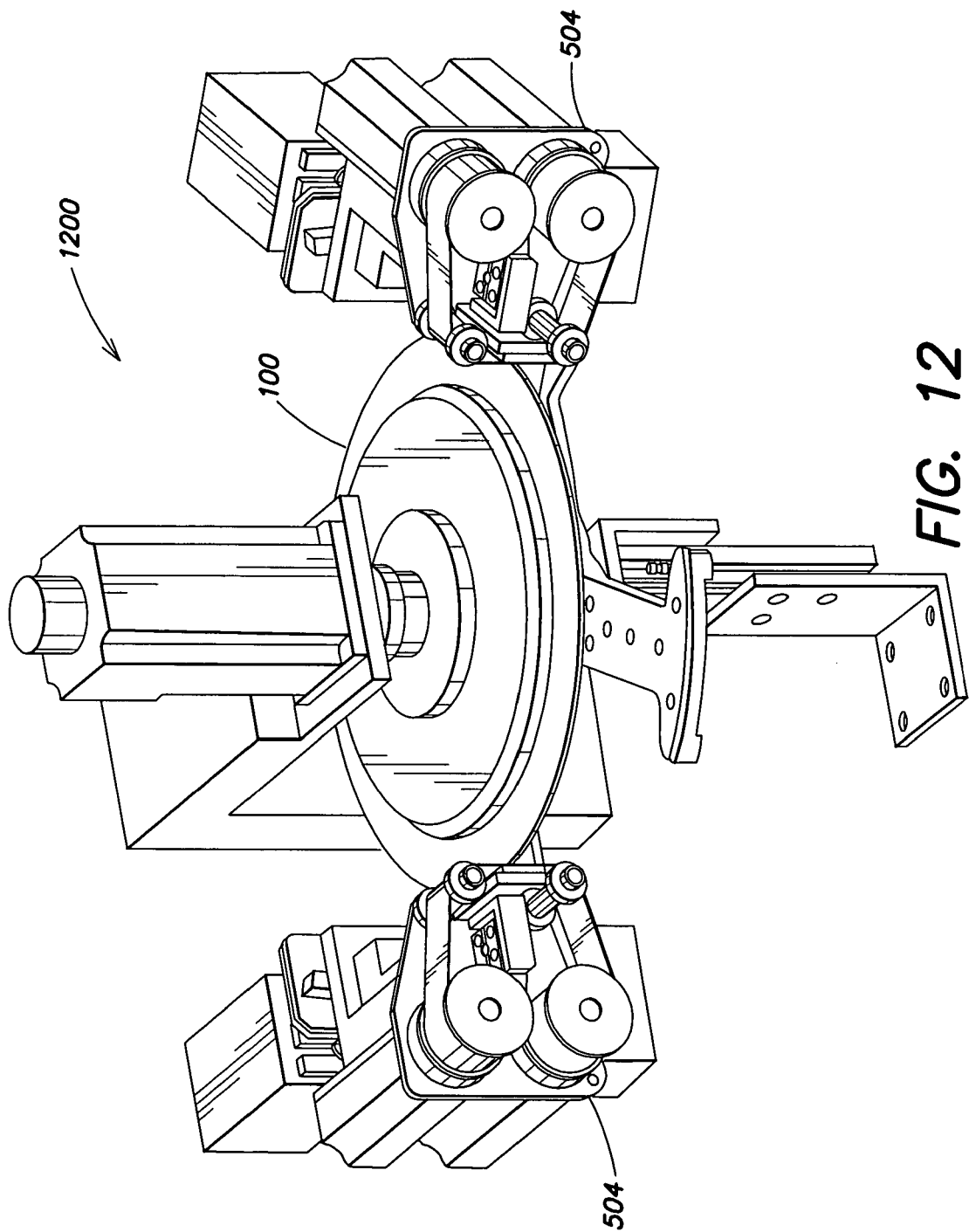
FIG. 12 is a perspective view of another embodiment of a multiple head edge polishing apparatus according to the present invention.
Figure 13:
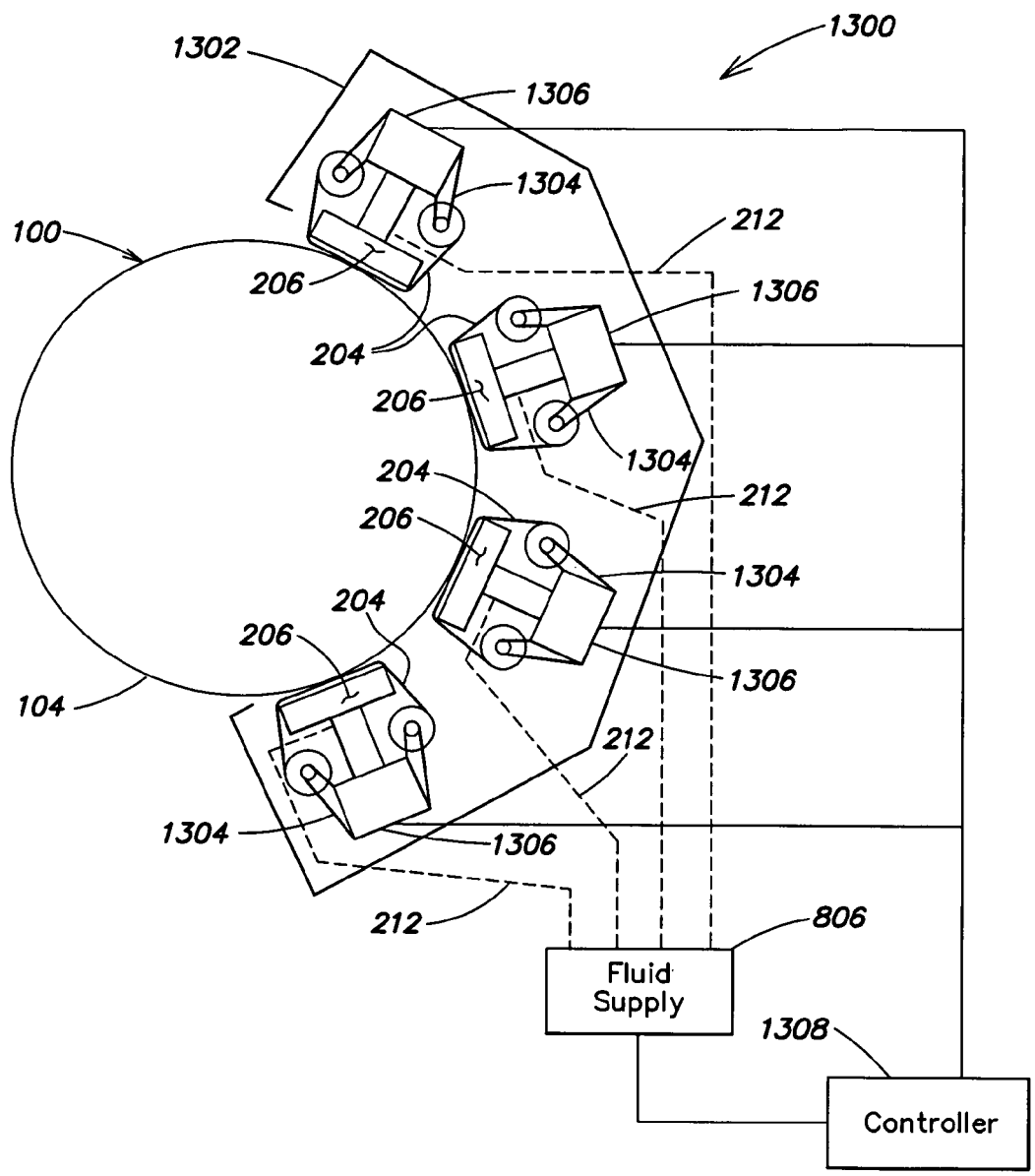
FIG. 13 is a perspective view of yet another embodiment of a multiple head edge polishing apparatus according to the present invention.

Turning to FIGS. 11 through 12, additional embodiments of an edge polishing apparatus are depicted. FIG. 11 depicts an edge polishing apparatus 1100 including three heads 404, FIG. 12 depicts an edge polishing apparatus 1200 including two heads 504, and FIG. 13 depicts an edge polishing apparatus 1300 including four heads 1304. As suggested by the drawings, any number and type of heads 404, 504, 1304 may be used in any practicable combination. In addition, in such multi-head embodiments, each head 404, 504, 1304 may used a differently configured or type of polishing film 204 (e.g., different grits, materials, tensions, pressures, etc.). Any number of heads 404, 504, 1304 may be used concurrently, individually, and/or in a sequence. Different heads 404, 504, 1304 may be used for different substrates 100 or different types of substrates. For example, a first head 404 with a stiff biasing device 406 supporting a pad 206 such as the concave pad 206B and a coarse grit polishing film 204 may initially be used to remove a relatively large amount of rough material from the substrate bevels 112, 114 (FIG. 1). The first head 404 may be appropriately positioned to access the bevels 112, 114. After cleaning with the first head 404 is completed, the first head 404 may be backed away from the substrate 100, and a second head 504 with a fine grit polishing film 204 (and without a pad) may be moved into position to polish the bevels 112, 114 and the outer edge 110.

After cleaning one or more substrates 100, the portion of the polishing film 204 employed for such cleaning may become worn. Therefore, the take-up reel 210 (FIG. 4) may be driven to draw the polishing film 204 by a fixed amount from the supply reel 210 (FIG. 4) toward the take-up reel 210. In this manner, an unused portion of the polishing film 204 may be provided between the take-up reel 210 and supply reel 208. The unused portion of the polishing film 204 may be employed to subsequently clean one or more other substrates 100 in a manner similar to that described above. Consequently, the apparatus 1100, 1200 may replace a worn portion of polishing film 204 with an unused portion with little or no impact on substrate processing throughput. Likewise, if replaceable cassettes 700A are employed, impact on throughput may be minimized by quickly replacing the cassettes 700A when all the polishing film 204 in the cassette 700A is used.

Regarding the example embodiment of an edge polishing apparatus 1300 of FIG. 13 specifically, a frame 1302 that supports multiple heads 1304 is depicted in schematic form. The heads 1304 are each mounted to the frame 1302 and each include an actuator 1306 (e.g., pneumatic piston, servo driven slide, hydraulic ram, etc.) adapted to press a pad 206 and a length of polishing film 204 against the edge 104 of a substrate 100 in response to a control signal from a controller 1308 (e.g., a programmed computer, an operator directed valve system, an embedded real time processor, etc.). Note that the controller 1308 is coupled (e.g., electrically, mechanically, pneumatically, hydraulically, etc.) to each of the actuators 1306.

In addition, a fluid supply 806 may be coupled to and under the control of the controller 1308. The fluid supply 806 may be controlled to independently deliver fluids (e.g., (e.g., DI water, cleaning chemistry, sonicated fluids, gas, air, etc.) to each of the heads 1304 via one or more fluid channels 212. Under the direction of the controller 1308, various fluids may be selectively delivered to the pads 206, the polishing film 204, and/or the substrate edge 104 via the fluid channels 212. The fluid may be for use in polishing, lubricating, particle removal/rinsing, and/or inflating a bladder 802 (FIG. 8C) within the pads 206. For example, in some embodiments, the same fluid delivered through a permeable pad 206 may be used for both polishing and inflating the pad 206 while a different fluid, delivered to the same head 1304 via a second channel (not shown) is used for rinsing and lubricating.

The foregoing description discloses only exemplary embodiments of the invention. Modifications of the above disclosed apparatus and methods which fall within the scope of the invention will be readily apparent to those of ordinary skill in the art. For instance, although only examples of cleaning a round substrate are disclosed, the present invention could be modified to clean substrates having other shapes (e.g., a glass or polymer plate for flat panel displays). Further, although processing of a single substrate by the apparatus is shown above, in some embodiments, the apparatus may process a plurality of substrates concurrently.

Accordingly, while the present invention has been disclosed in connection with exemplary embodiments thereof, it should be understood that other embodiments may fall within the spirit and scope of the invention, as defined by the following claims.

The invention claimed is:

1. An apparatus adapted to polish an edge of a substrate comprising:
    a flexible polishing film adapted to contour to a substrate;
    a frame adapted to tension at least a first length of the flexible polishing film, wherein the first length of flexible polishing film forms a first plane prior to contact with a substrate; and
    a substrate rotation driver adapted to rotate the substrate against the flexible polishing film along a portion of the first length such that the substrate extends into the first plane and the flexible polishing film is adapted to:
        apply tension to the substrate,
        contour to an edge of the substrate, the edge including at least an outer edge and a first bevel, and
        polish the outer edge and the first bevel as the substrate is rotated;
    wherein the substrate edge extends out beyond the substrate rotation driver; and
    wherein the frame is further adapted to angularly translate the flexible polishing film about the substrate edge.

2. The apparatus of claim 1 wherein the frame includes a supply spool and a take-up spool for the flexible polishing film, and wherein the frame is further adapted to allow the portion of the flexible polishing film that contacts the substrate to be replaced.

3. The apparatus of claim 2 wherein the flexible polishing film spans, in a longitudinal direction, between the supply spool and the take-up spool, and wherein the substrate rotation driver moves the edge of the substrate in the longitudinal direction of the flexible polishing film.

4. The apparatus of claim 1 wherein the flexible polishing film and the frame are contained in a replaceable cassette.

5. The apparatus of claim 1 wherein the frame is further adapted to angularly translate the flexible polishing film around an axis tangential to the outer edge of the substrate so as to cause the flexible polishing film to contact the outer edge, the first bevel, and a second bevel of the substrate.

6. The apparatus of claim 1 wherein the frame is further adapted to circumferentially rotate, with respect to the substrate, the flexible polishing film around the edge of the substrate.

7. The apparatus of claim 1 further comprising a fluid supply channel, and wherein the fluid supply channel is adapted to deliver fluid to the edge of the substrate.

8. The apparatus of claim 7 wherein the fluid supply channel is further adapted to deliver fluid to the edge of the substrate via the flexible polishing film.

9. The apparatus of claim 7 wherein the fluid supply channel is adapted to deliver sonic energy to the edge of the substrate.

10. The apparatus of claim 7 wherein the fluid includes at least one of water and a cleaning chemistry.

11. An apparatus adapted to polish an edge of a substrate comprising:
    a plurality of flexible polishing films adapted to contour to a substrate;
    at least one frame adapted to tension each of the flexible polishing films along at least a first length of each flexible polishing film, wherein the first length of each flexible polishing film forms a first plane prior to contact with the substrate; and
    a substrate rotation driver adapted to rotate the substrate against a portion of the first length of at least one of the flexible polishing films such that the substrate extends into the first plane and such that any flexible polishing films contacting the substrate apply pressure to the substrate, contour to an edge of the substrate, and polish the edge as the substrate is rotated;
    wherein the substrate edge extends out beyond the substrate rotation driver; and
    wherein the at least one frame is further adapted to angularly translate the flexible polishing film about the substrate edge.

12. The apparatus of claim 11 wherein the plurality of flexible polishing films include films having different abrasives.

13. The apparatus of claim 11 wherein the frame includes a plurality of heads, and wherein each head is adapted to support at least one flexible polishing film, and wherein the heads are adapted to approximately concurrently bring supported flexible polishing film into contact with the edge of the substrate.

14. The apparatus of claim 11 wherein the frame includes a plurality of heads, and wherein each head is adapted to support at least one flexible polishing film, and wherein each head includes a pad adapted to hold the supported flexible polishing film in contact with the edge of the substrate at different times.

15. The apparatus of claim 14 wherein the pad of each head is adapted to push the head's flexible polishing film against the rotating substrate in response to an actuator pushing on the pad.

16. The apparatus of claim 14 wherein each flexible polishing film and each head are contained in a replaceable cassette.

17. The apparatus of claim 14 wherein the frame is further adapted to angularly translate the flexible polishing film of each head around respective axes that are tangential to the outer edge of the substrate so as to cause the flexible polishing film to contact the outer edge, the first bevel, and a second bevel of the substrate.

18. The apparatus of claim 14 wherein the frame is further adapted to circumferentially rotate, with respect to the substrate, the flexible polishing film of each head around the edge of the substrate.

19. The apparatus of claim 11 further comprising a fluid supply channel, and wherein the fluid supply channel is adapted to deliver a fluid to the edge of the substrate.

20. The apparatus of claim 14 further comprising a fluid supply channel, and wherein the fluid supply channel is further adapted to deliver a fluid to the edge of the substrate via the flexible polishing film of each head.

21. The apparatus of claim 19 wherein the fluid supply channel is adapted to deliver sonic energy to the edge of the substrate.

22. The apparatus of claim 19 wherein the fluid includes at least one of water and a cleaning chemistry.

23. An apparatus adapted to polish an edge of a substrate comprising:
   a flexible polishing film adapted to contour to a substrate;
   a contoured pad pre-formed to match a contour of an edge of a substrate, wherein the contoured pad is adapted to conform to the edge of the substrate;
   a frame adapted to tension at least a first length of the flexible polishing film, wherein the first length of flexible polishing film forms a first plane prior to contact with the substrate; and
   a substrate rotation driver adapted to rotate the substrate against the flexible polishing film along a portion of the first length such that the substrate extends into the first plane and the flexible polishing film is adapted to:
      apply tension to the substrate,
      contour to the edge of the substrate, the edge including at least an outer edge and a first bevel, and
      polish the outer edge and the first bevel as the substrate is rotated;
   wherein the substrate edge extends out beyond the substrate rotation driver; and
   wherein the frame is further adapted to angularly translate the flexible polishing film about the substrate edge.

* * * * *